United States Patent
Ogusu

(10) Patent No.: US 7,859,599 B2
(45) Date of Patent: Dec. 28, 2010

(54) BROADCAST RECEIVING DEVICE AND METHOD FOR SIMULTANEOUSLY RECEIVING TWO DIFFERENT PROGRAMS

(75) Inventor: Toru Ogusu, Kanagawa (JP)

(73) Assignee: Sony Corporation (JP)

( * ) Notice: Subject to any disclaimer, the term of this patent is extended or adjusted under 35 U.S.C. 154(b) by 1189 days.

(21) Appl. No.: 11/493,094

(22) Filed: Jul. 26, 2006

(65) Prior Publication Data
US 2007/0070256 A1    Mar. 29, 2007

(30) Foreign Application Priority Data
Jul. 29, 2005    (JP)    ............................ P2005-221258

(51) Int. Cl.
*H04N 5/60* (2006.01)
(52) U.S. Cl. ........................ 348/738; 348/632; 348/729; 348/564; 381/104
(58) Field of Classification Search ................ 348/738, 348/736, 632, 462, 729, 564, 563, 565; 381/104, 381/107, 109
See application file for complete search history.

(56) References Cited

U.S. PATENT DOCUMENTS

| | | | | |
|---|---|---|---|---|
| 5,910,996 | A * | 6/1999 | Eggers et al. | ................ 381/107 |
| 6,710,816 | B1 * | 3/2004 | Minami | ....................... 348/554 |
| 6,741,293 | B1 * | 5/2004 | Obuchi | ....................... 348/554 |

FOREIGN PATENT DOCUMENTS

| | | | |
|---|---|---|---|
| JP | 6-233203 | A | 8/1994 |
| JP | 11-355684 | A | 12/1999 |
| JP | 11-355691 | A | 12/1999 |
| JP | 2001-054037 | A | 2/2001 |

* cited by examiner

*Primary Examiner*—David L Ometz
*Assistant Examiner*—Jean W Désir
(74) *Attorney, Agent, or Firm*—Lerner, David, Littenberg, Krumholz & Mentlik, LLP

(57) ABSTRACT

A broadcast receiving device includes a receiver configured to selectively receive two programs; an analyzer configured to analyze sound volume levels of the two programs for a certain time; and an adjuster configured to adjust the relative sound volume levels of the two programs, when the analysis indicates that there is a difference between the sound volume levels of the two programs, so as to control the difference between the sound volume levels to within a predetermined reference level difference.

10 Claims, 4 Drawing Sheets

BROADCAST RECEIVING DEVICE AND METHOD FOR SIMULTANEOUSLY RECEIVING TWO DIFFERENT PROGRAMS

CROSS-REFERENCE TO RELATED APPLICATIONS

The present application claims priority from Japanese Patent Application No. JP 2005-221258 filed on Jul. 29, 2005, the disclosure of which is hereby incorporated by reference herein.

BACKGROUND OF THE INVENTION

1. Field of the Invention

The present invention relates to a broadcast receiving device and a broadcast receiving method that simultaneously receive a terrestrial digital broadcast and an analog broadcast, for example.

2. Description of the Related Art

Terrestrial digital broadcasting started in 2003. Since the start of the terrestrial digital broadcasting, there have been an increasing number of cases where exactly same contents are transmitted by analog broadcasting and the terrestrial digital broadcasting simultaneously in a same time period. For example, FIG. 4 is a diagram showing an example of receiving two programs of analog broadcasting and digital broadcasting on two screens. A television receiver 41 in FIG. 4 can simultaneously receive two programs, that is, an analog broadcast program A indicated by 42 and a digital broadcast program D indicated by 43 in two picture areas on a screen. At this time, speakers 44 and 45 output the audio of the analog broadcast program A or the digital broadcast program D selected by the television receiver 41.

There is currently a broadcast receiver that allows manual audio level setting for each of terrestrial digital broadcasting, BS (Broadcasting Satellite) digital broadcasting, and terrestrial analog broadcasting. For example, FIG. 5 is a diagram showing an example of receiving two programs of terrestrial digital broadcasting and BS digital broadcasting on two screens. A television receiver 51 in FIG. 5 can simultaneously receive two programs, that is, a terrestrial digital broadcast program indicated by 52 and a BS digital broadcast program indicated by 53 in two picture areas on a screen. At this time, speakers 54 and 55 output the audio of the terrestrial digital broadcast program or the BS digital broadcast program selected by the television receiver 51.

In addition, a broadcast receiving device is proposed which stores a specified value of sound output volume for each channel, and when a receiving channel is changed, refers to the specified value, and automatically adjusts sound output volume to a corresponding sound volume (see Japanese Patent Laid-open No. 2001-54037, Patent Document 1).

However, in the above-described television receiver 41 shown in FIG. 4, at a time of program switching when the two programs, that is, the analog broadcast program A and the digital broadcast program D received on the two screens have identical contents, a difference between the sound volumes of the analog broadcast program A and the digital broadcast program D selected by the television receiver 41 may become noticeable. The audio of the analog broadcast program A or the digital broadcast program D is output from the speakers 44 and 45. It is thus difficult to say that a setting is convenient for users. There is also an inconvenience of having to manually set an audio level for each program.

In analog broadcasting, transmitting power is not specifically limited by standards, and therefore transmitting power differs for different broadcasting stations. On the other hand, in digital broadcasting, transmitting power is limited by standards. In addition, the transmitting power of the analog broadcasting is higher than the transmitting power of the digital broadcasting. This is a reason that there is a large difference in sound volume between the analog broadcasting and the digital broadcasting.

Further, even in a same digital or analog broadcasting format, the sound volume of a channel dedicated to movies or a channel dedicated to sports may be larger than that of a channel for other contents. This is another factor in sound volume difference.

In addition, the technique described in the foregoing Patent Document 1 needs a specified value of sound output volume to be stored for each channel. Since the digital broadcasting has a few hundred channels, there is an inconvenience of requiring a massive storage capacity.

It is accordingly desirable to provide a broadcast receiving device and a broadcast receiving method that can finely and automatically correct sound volume level not only for each broadcast but also for each program and each genre at the time of program switching, and which provide good usability for a user.

SUMMARY OF THE INVENTION

According to an embodiment of the present invention, a broadcast receiving device includes receiving means for selectively receiving two programs; analyzing means for analyzing sound volume levels of the two programs for a certain time; and adjusting means for adjusting the relative sound volume levels of the two programs, when the analysis indicates that there is a difference between the sound volume levels of the two programs, so as to control the difference between the sound volume levels to within a predetermined reference level difference.

According to an embodiment of the present invention, a broadcast receiving method includes selectively receiving two programs; storing sound volume levels of the two programs for a certain time; switching audio output between the two programs; and analyzing the sound volume levels of the two programs. The sound volume levels of the two programs are stored for the certain time when the switching is performed. The broadcast receiving method further includes adjusting the relative sound volume levels of the two programs so as to control the difference between the sound volume levels to within a predetermined reference level difference when the analysis shows that there is a difference between the sound volume levels of the two programs.

For example, in a television receiver that can simultaneously receive an analog broadcast and a digital broadcast, when the same contents are transmitted in the analog broadcast and the digital broadcast, a sound volume difference at this time may become noticeable. In addition, a sound volume difference can occur each time a channel is changed or each time a reproduction genre is changed on the same channel. Accordingly, in order to eliminate the sound volume difference at the time of program switching, a broadcast receiving device and a broadcast receiving method that can automatically adjust sound volume are provided. Thereby, even when two desired programs are selected and received, peak values, integrated values, and average audio level values or the like of audio data of the two programs are analyzed after the audio data is stored for a certain time, and sound volume can be corrected such that the values of the two programs become close to each other.

According to the present invention, it is possible to finely and automatically correct the sound volume level not only for each broadcast, but also for each program and each genre at the time of program switching. Thereby, operability in sound volume adjustment at the time of program switching can be improved.

DETAILED DESCRIPTION

An embodiment of the present invention will hereinafter be described with reference to the drawings as appropriate.

Figure 4:
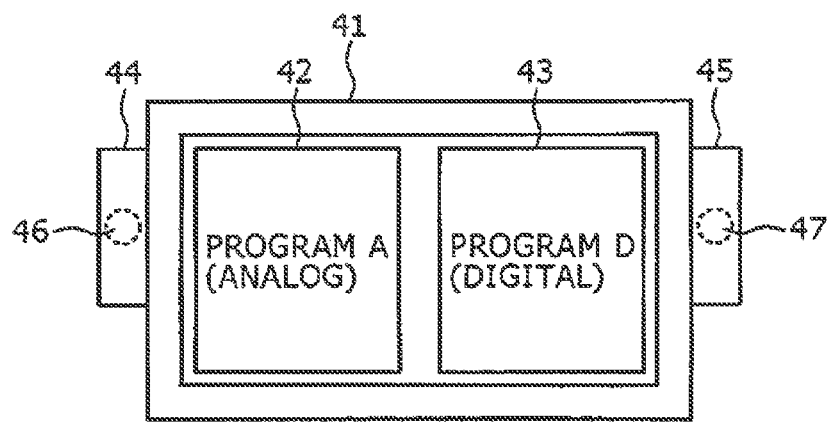
FIG. 4 is a diagram showing an example of receiving two programs of analog broadcasting and digital broadcasting on two screens.
Figure 5:
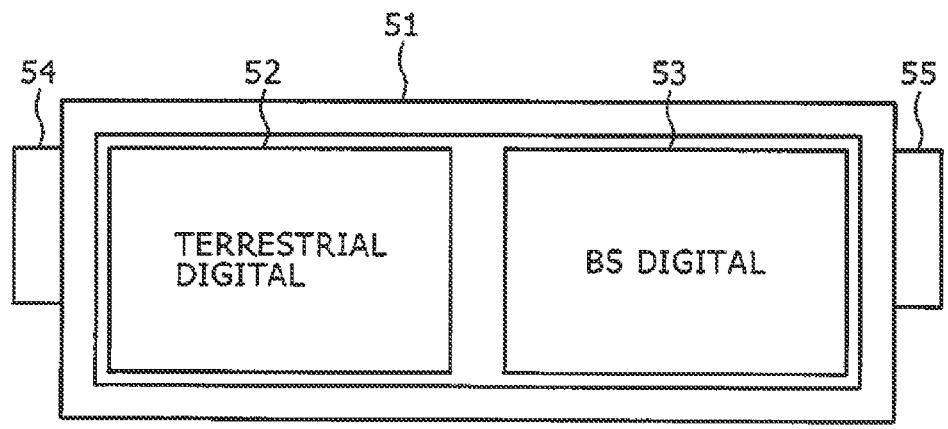
FIG. 5 is a diagram showing an example of receiving two programs of terrestrial digital broadcasting and BS digital broadcasting on two screens.

In this embodiment, description will be made of a case where as described in FIG. 4, two programs, that is, a terrestrial analog broadcast program A and a digital broadcast program B are received simultaneously, and the sound volume levels of the two programs at a time of program switching are automatically adjusted.

Figure 1:
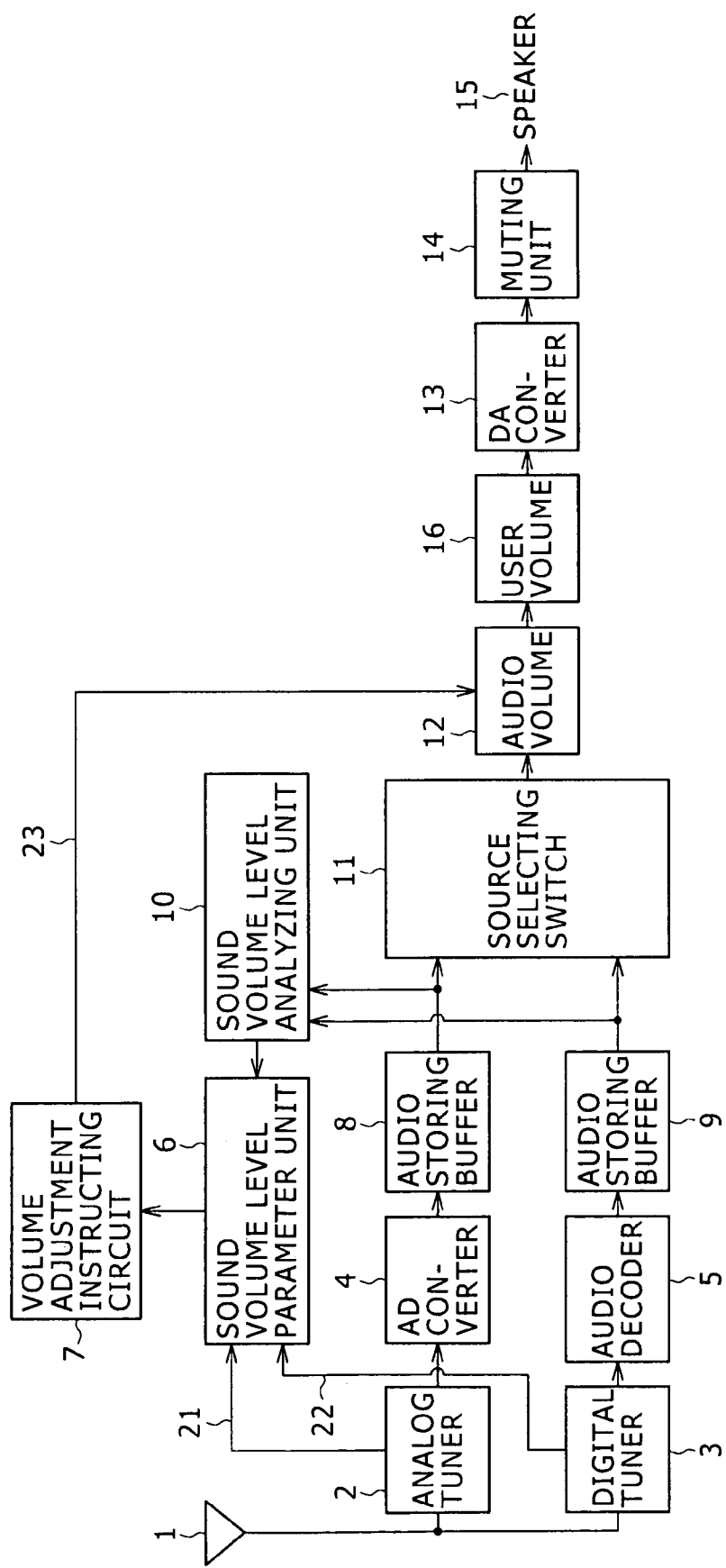
FIG. 1 is a block diagram of an audio system of a receiving device.

FIG. 1 is a block diagram of an audio system of a receiving device.

In FIG. 1, an antenna 1 receives radio waves of analog and digital broadcasting. An analog tuner 2 selectively receives the terrestrial analog broadcast program A shown in FIG. 4. A digital tuner 3 selectively receives the digital broadcast program D. In this case, without limitation to this, two programs, that is, a desired program and another program may be selectively received.

As will be described later, in analyzing sound volume levels, the two programs are converted into digital linear PCM (Pulse Code Modulation) signals for comparison. Therefore, an AD (Analog to Digital) converter 4 converts the analog program into a digital linear PCM signal. An audio decoder 5 decodes compressed digital source data of the digital program and converts the digital source data into a linear PCM signal.

Thus, the analog broadcast program A and the digital broadcast program D are converted into the same linear PCM format. The linear PCM signals of the analog broadcast program A and the digital broadcast program D are stored as audio data in audio storing buffers 8 and 9. The audio storing buffers 8 and 9 are formed by ring buffers, for example. The audio storing buffers 8 and 9 store continuous audio data while repeatedly overwriting a certain amount of data.

A source selecting switch 11 selectively selects the audio data, which is stored in the audio storing buffer 8, of the analog broadcast program A or the audio data, which is stored in the audio storing buffer 9, of the digital broadcast program D. The source selecting switch 11 outputs the audio data to an audio volume 12. For example, an infrared command signal transmitted by operating a remote commander is received by the main unit device, so that the source selecting switch 11 operates to perform source switching between the analog broadcast program A and the digital broadcast program D.

At this time, on the basis of the audio data stored in the audio storing buffers 8 and 9, a sound volume level analyzing unit 10 analyzes the sound volume levels of the two linear PCM signals of the analog broadcast program A and the digital broadcast program D. A method of analyzing the sound volume levels in the sound volume level analyzing unit 10 uses a comparison of sound volume peak values, a comparison of sound volume integrated values, or a comparison of sound volume average level values.

Figure 3A:
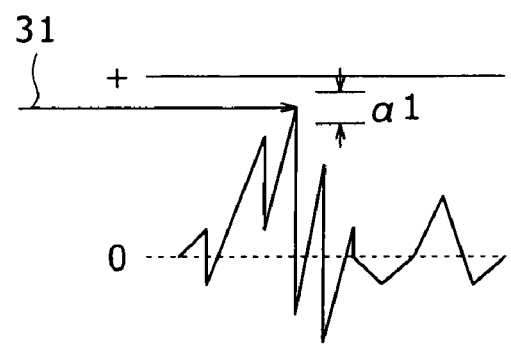
FIGS. 3A, 3B, and 3C represent sound volume level comparing methods, FIG. 3A representing a peak value comparison, FIG. 3B representing an integrated value comparison, and FIG. 3C representing an average value comparison.
Figure 3B:
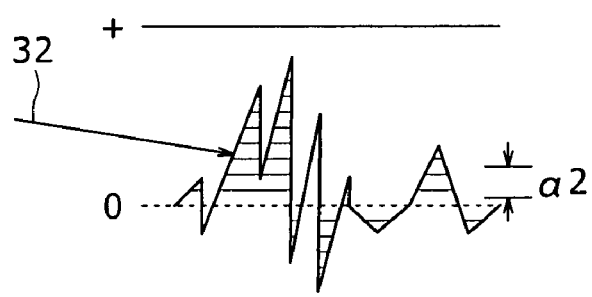
Figure 3C:

FIGS. 3A, 3B, and 3C represent sound volume level comparing methods. FIG. 3A represents a peak value comparison. FIG. 3B represents an integrated value comparison. FIG. 3C represents an average value comparison.

In the audio level comparison represented in FIG. 3A, peak values of the sound volume levels of the two programs are analyzed for a certain time (a length of time during which peaks to be compared appear, for example), as indicated by 31, for the peak value comparison. When a difference between the peak sound volume levels is a threshold value $\alpha 1$ or more which represents a certain reference level difference, the sound volume level to be described later is adjusted such that the level difference is controlled to within the threshold value $\alpha 1$.

In analyzing the peak values, assigning a weight to sound volume levels in each frequency band of the audio, for example, is necessary. A human ear, in particular, acts as a high-pass/low-pass filter for frequencies in a high frequency band and a low frequency band with the same sound volume level. Therefore peak values in the bands are removed.

In the audio level comparison represented in FIG. 3B, the audio outputs of the two programs are captured for a certain time (a length of time during which areas to be compared appear, for example), and the sound volume levels of the audio outputs are integrated, as indicated by 32, for the integrated value comparison. When a difference between the integrated values of the two programs is a threshold value $\alpha 2$ or more which represents a reference level difference, the sound volume level to be described later is adjusted such that the level difference is controlled to within the threshold value $\alpha 2$ representing the reference integrated value difference.

For example, when the two programs have same contents broadcast during a same time period, transitions of sound volume levels are similar to each other, and therefore the integrated value comparison is particularly effective.

In the audio level comparison represented in FIG. 3C, the audio outputs of the two programs are captured for a certain time (a length of time during which averages to be compared are obtained, for example), distributions of the sound volume levels of the audio outputs are analyzed, and average audio levels are extracted, as indicated by 33, for the average value comparison. The sound volume level to be described later is adjusted such that a difference between the average audio levels is controlled to within a threshold value $\alpha 3$ representing a reference level difference.

For example, in sound volume adjustment for contents in totally different reproduction genres, when the volume adjustment is performed on the basis of the peak values of the sound volumes, the volume may be lowered on the basis of instantaneous peak values. Thus, audio level correction between channels can be performed more properly by using a method of comparing average sound volume levels and performing adjustment rather than peak values.

At this time, since a genre signal 21 of the analog broadcast program A is supplied from the analog tuner 2 to a sound volume level parameter unit 6 to be described later and a genre signal 22 of the digital broadcast program D is supplied from the digital tuner 3 to the sound volume level parameter unit 6, the average values are compared with each other according to the genre signals 21 and 22. The above-described threshold values α1, α2, and α3 are each set such that a viewer does not perceive a difference between audio output levels before and after the switching. That is, the above-described threshold values α1, α2, and α3 are each set such that the sound volume level similar to a sound volume level adjusted in an immediately preceding timing is obtained, for example.

Next, on the basis of a result of the analysis of the sound volume level analyzing unit 10, the sound volume level to be adjusted is stored as a parameter value in the sound volume level parameter unit 6 so that the level difference is controlled to within the above-described threshold value α1, α2, or α3. At this time, the genre signals 21 and 22 are also stored as parameter values.

Then, on the basis of the parameter values stored in the sound volume level parameter unit 6, a volume adjustment instructing circuit 7 supplies a volume adjusting signal 23 to the audio volume 12 to instruct the audio volume 12 to adjust the sound volume level.

Thus, the sound volume level of the audio volume 12 is adjusted such that a viewer does not perceive a difference between audio output levels before and after the switching. Incidentally, the adjustment of the sound volume level of the audio volume 12 on the basis of the volume adjusting signal 23 from the volume adjustment instructing circuit 7 is performed repeatedly until the level difference analyzed in the sound volume level analyzing unit 10 is controlled to within the above-described threshold value α1, α2, or α3 each time a switching is performed.

Then, the audio data adjusted in sound volume level by the audio volume 12 is passed through a user volume 16 and converted from digital data to an analog signal by a DA (Digital to Analog) converter 13. Sound is then output from a speaker 15.

At this time, a viewer does not need to perform manual adjustment by the user volume 16.

Figure 2:
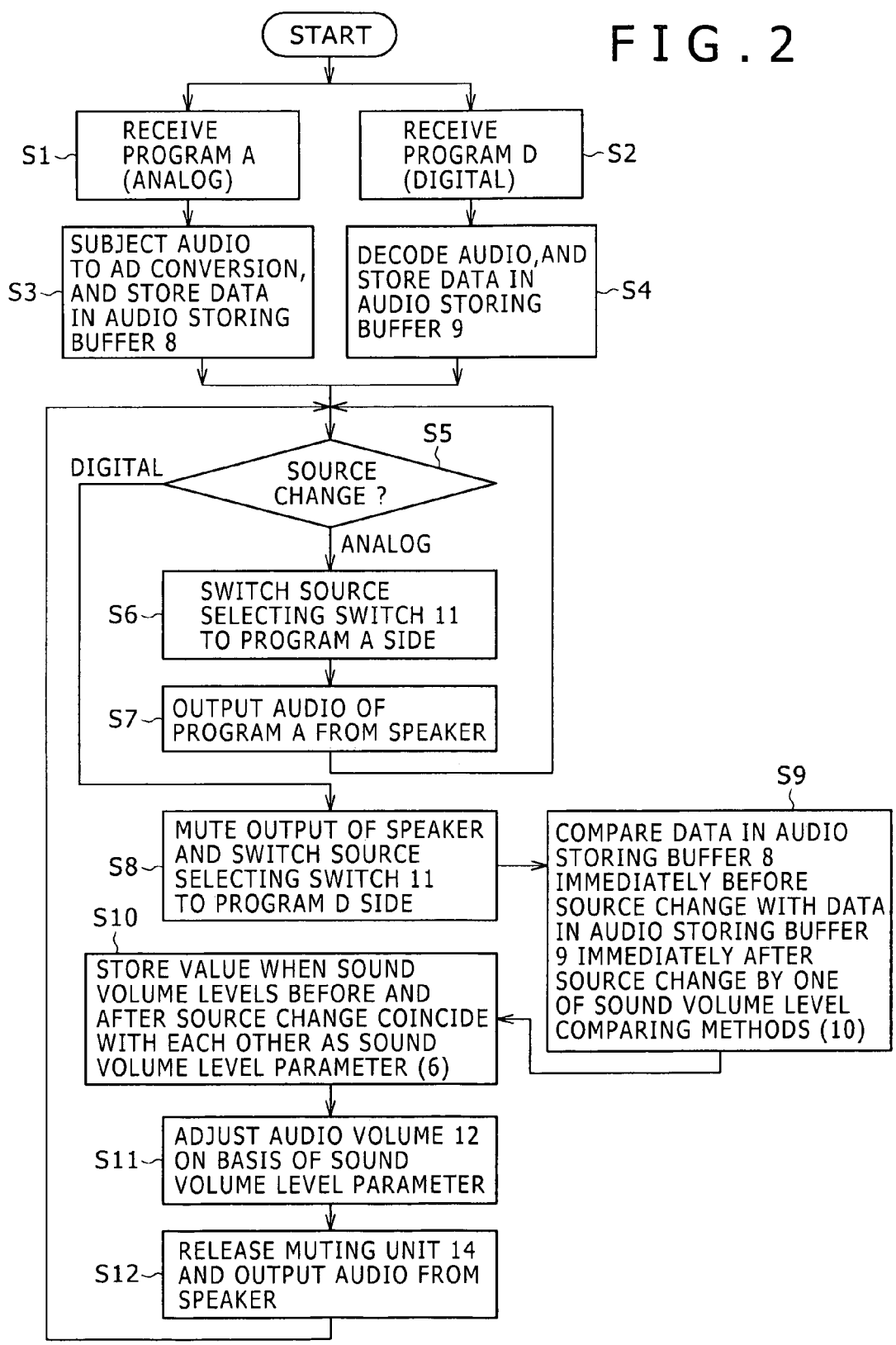
FIG. 2 is a flowchart of a volume adjusting operation.

FIG. 2 is a flowchart of a volume adjusting operation. FIG. 2 represents a volume adjusting operation of the audio system of the receiving device shown in FIG. 1 when source switching is performed from the analog broadcast program A to the digital broadcast program D.

In FIG. 2, the program A (analog broadcasting) is received, and the program D (digital broadcasting) is received (step S1 and step S2). The two linear PCM signals of the analog broadcast program A and the digital broadcast program D are stored as audio data in the audio storing buffers 8 and 9 (step S3 and step S4).

The source selecting switch 11 determines whether there is an instruction for source switching (step S5). When analog broadcasting is selected in step S5, the source selecting switch 11 switches a contact to an analog broadcasting output side (step S6), and the audio of the analog broadcasting program A which audio is stored in the audio storing buffer 8 is output from the speaker 15 (step S7).

When the source selecting switch 11 determines in step S5 that switching from analog broadcasting to digital broadcasting is selected, a muting unit 14 mutes the output of the speaker 15, and the source selecting switch 11 switches the contact to a digital broadcasting output side (step S8).

At this time, on the basis of the audio data stored in the audio storing buffers 8 and 9, the sound volume level analyzing unit 10 analyzes the sound volume levels of the two linear PCM signals of the analog broadcast program A immediately before the source switching and the digital broadcast program D immediately after the source switching (step S9). A method of analyzing the sound volume levels in the sound volume level analyzing unit 10 uses the comparison of sound volume peak values, the comparison of sound volume integrated values, or the comparison of sound volume average level values as represented in FIGS. 3A, 3B, and 3C.

Next, on the basis of a result of analysis of the sound volume level analyzing unit 10, the sound volume level to be adjusted is stored as a parameter value in the sound volume level parameter unit 6 so that sound volume levels before and after the source switching approximately coincide with each other, or specifically the level difference is controlled to within the above-described threshold value α1, α2, or α3 (step S10).

Then, on the basis of the parameter value stored in the sound volume level parameter unit 6, the volume adjustment instructing circuit 7 supplies a volume adjusting signal 23 to the audio volume 12 to instruct the audio volume 12 to adjust the sound volume level (step S11). At this time, the sound volume level of the audio volume 12 is adjusted such that a viewer does not perceive a difference between audio output levels before and after the switching.

Then, the muting, which is started in step S8, of the output of the speaker 15 by the muting unit 14 is ended, and the audio, which is stored in the audio storing buffer 9, of the digital broadcast program D is output from the speaker 15 (step S12).

The process then returns to step S5 to repeat a process from step S8 to step S12 each time switching is performed.

When a transition of the sound volume level (for example from a high level to a low level, or from a low level to a high level) is not known in channel switching, it suffices to compare sound volume levels in step S9 at all times when the switching is performed. FIG. 2 represents only an example in which analog broadcasting has a normal sound volume level and digital broadcasting has a relatively high sound volume level.

The above-described embodiment of the present invention automatically corrects not only the sound volume levels of different broadcasting systems but also the sound volume levels of channels of a same broadcasting system. Thus, when a channel is changed, it is possible to prevent sound volume from becoming too high or too low, and prevent causing of a difference in auditory perception level of a viewer.

For example, when broadcasting stations simultaneously transmit same contents by test waves of the stations or the like, and sound volume levels of the broadcasting stations are desired to be adjusted, the broadcast receiving device can easily perform the level adjustment.

It is needless to say that the present invention is not limited to the foregoing embodiment, and that the configuration can be changed as appropriate without departing from the spirit of the present invention described in claims.

The invention claimed is:

1. A broadcast receiving device for simultaneously receiving two different programs, the broadcast receiving device comprising:

receiving means for selectively receiving two programs;

analyzing means for converting each of the received two programs into respective digital linear pulse code modulation signals and for analyzing sound volume levels of the two programs for a certain time by use of the digital linear pulse code modulation signals; and adjusting means for adjusting the relative sound volume levels of the two programs, when the analysis by the analyzing means indicates that there is a difference between the sound volume levels of the two programs, so as to control the difference between the sound volume levels to within a predetermined reference level difference.

2. The broadcast receiving device as claimed in claim 1, wherein when at least an audio signal is switched from an audio signal of one of the two programs to an audio signal of the other of the two programs, and when the result of the analysis by the analyzing means indicates that there is a difference between the sound volume levels of the two programs, the adjusting means adjusts the relative sound volume levels of the two programs so as to control the difference between the sound volume levels to within the predetermined reference level difference.

3. The broadcast receiving device as claimed in claim 2, wherein when at least the audio signal is switched from the audio signal of one of the two programs to the audio signal of the other of the two programs, the analyzing means analyzes for a certain time an audio level immediately before the switching in an audio storing buffer corresponding to the one program and an audio level immediately after the switching in an audio storing buffer corresponding to the other program.

4. The broadcast receiving device as claimed in claim 1, wherein the broadcast receiving device is configured to simultaneously receive an analog broadcast and a digital broadcast, and the receiving means selectively receives a desired program from each of the analog broadcast and the digital broadcast.

5. The broadcast receiving device as claimed in claim 1, wherein the difference between the sound volume levels is a difference between peak values of audio signals of the two programs.

6. The broadcast receiving device as claimed in claim 1, wherein the difference between the sound volume levels is a difference between integrated values of audio signals of the two programs.

7. The broadcast receiving device as claimed in claim 1, wherein the difference between the sound volume levels is a difference between average values of audio signals of the two programs.

8. The broadcast receiving device as claimed in claim 1, wherein the two programs are broadcast by different broadcasting systems.

9. A broadcast receiving method for simultaneously receiving two different programs, the broadcast receiving method comprising:
    selectively receiving two programs;
    converting each of the received two programs into respective digital linear pulse code modulation signals and storing the digital linear pulse code modulation signals as sound volume levels of the two programs for a certain time;
    switching audio output between the two programs, the sound volume levels of the two programs being stored for the certain time when the switching is performed;
    analyzing the sound volume levels of the two programs, stored for the certain time when the switching is performed by use of the digital linear pulse code modulation signals; and
    adjusting the relative sound volume levels of the two programs so as to control the difference between the sound volume levels to within a predetermined reference level difference when a result of the analysis shows that there is a difference between the sound volume levels of the two programs.

10. A broadcast receiving device for simultaneously receiving two different programs, the broadcast receiving device comprising:
    a receiver configured to selectively receive two programs;
    an analyzer configured to convert each of the received two programs into respective digital linear pulse code modulation signals and configured to analyze sound volume levels of the two programs for a certain time by use of the digital linear pulse code modulation signals; and
    an adjuster configured to adjust the relative sound volume levels of the two programs, when the analysis by the analyzer indicates that there is a difference between the sound volume levels of the two programs, so as to control the difference between the sound volume levels to within a predetermined reference level difference.

* * * * *